(12) United States Patent
Furuta et al.

(10) Patent No.: US 6,621,092 B1
(45) Date of Patent: Sep. 16, 2003

(54) REFLECTION TYPE SENSOR

(75) Inventors: Naofumi Furuta, Konan (JP); Naoaki Noda, Kasugai (JP); Kunio Oi, Nagoya (JP)

(73) Assignee: Sunx Limited, Aichi (JP)

( * ) Notice: Subject to any disclaimer, the term of this patent is extended or adjusted under 35 U.S.C. 154(b) by 100 days.

(21) Appl. No.: 09/704,536

(22) Filed: Nov. 3, 2000

(30) Foreign Application Priority Data

Feb. 4, 2000 (JP) ........................................ 2000-028230

(51) Int. Cl.⁷ ............................................... G01N 21/86
(52) U.S. Cl. ............................ 250/559.4; 250/559.29; 250/559.36
(58) Field of Search .............................. 250/226, 559.4, 250/559.36, 559.45, 221; 414/936, 937, 938, 940, 941

(56) References Cited

U.S. PATENT DOCUMENTS

| | | | |
|---|---|---|---|
| 3,910,701 A | * 10/1975 | Henderson et al. | ......... 250/226 |
| 4,926,867 A | 5/1990 | Kanda et al. | ................ 600/334 |
| 5,504,345 A | 4/1996 | Bartunek et al. | |
| 6,320,681 B1 | * 11/2001 | Yushiya | ....................... 358/475 |
| 6,423,978 B1 | * 7/2002 | Furuta et al. | ........... 250/559.36 |

FOREIGN PATENT DOCUMENTS

| | | |
|---|---|---|
| JP | 62-168527 | 10/1987 |
| JP | 9-282989 | 10/1997 |
| JP | 11-6767 | 1/1999 |
| TW | 137100 | 7/1990 |

* cited by examiner

*Primary Examiner*—Robert H. Kim
*Assistant Examiner*—Courtney Thomas
(74) *Attorney, Agent, or Firm*—Wenderoth, Lind & Ponack, L.L.P.

(57) ABSTRACT

A reflection type sensor includes a light emitting element emitting light to an object and including a plurality of LED chips disposed to be adjacent to each other and integrated into a package, and the LED chips emit light beams belonging to different wave bands. A light detecting element detects the light reflected on the object, and performs a photoelectric conversion for the light beams belonging to the different wave bands, thereby delivering a light signal. A light detecting circuit determines the presence or absence of the object on the basis of the light signal delivered from the light detecting element.

3 Claims, 7 Drawing Sheets

(A)

(B)

REFLECTION TYPE SENSOR

BACKGROUND OF THE INVENTION

1. Field of the Invention

This invention relates to a reflection type sensor emitting light to an object and detecting the light reflected by the object, thereby detecting the presence of the object.

2. Description of the Prior Art

Reflection type sensors have conventionally been used to detect an object such as a semiconductor wafer. The reflection type sensors comprise a light emitting element and a light detecting element. Light is emitted from the light emitting element to an edge of the wafer while the sensor is being moved across the wafer. The light is then reflected on the wafer edge to be detected by the light detecting element. Japanese Utility Model Publication Nos. 5-38761 and 6-70240 and Japanese Patent Publication No. 1-52897-A disclose conventional reflection type sensors respectively.

The wafer is sometimes coated with an oxide film or nitrogen film both absorbing light ranging in a certain wave band. When the wafer coated with such a light-absorbing film is detected by the conventional reflection type sensor, light emitted from the light emitting element is sometimes absorbed into the wafer but not reflected thereby, whereupon the wafer cannot be detected. In view of this problem, a plurality of types of reflection type sensors have conventionally been provided so that the sensor is changed from one to another every time the wafer is changed from one type to another. This results in troublesome changes of the reflection type sensors.

SUMMARY OF THE INVENTION

Therefore, an object of the present invention is to provide a reflection type sensor which can reliably detect the object even when the object absorbs light of a specific wave band.

The present invention provides a reflection type sensor comprising a light emitting element emitting light to an object and including a plurality of LED chips disposed to be adjacent to each other and integrated into a package, and the LED chips emit light beams belonging to different wave bands. A light detecting element detects the light reflected on the object and performs a photoelectric conversion for the light beams belonging to the different wave bands, thereby delivering a light signal. A light detecting circuit determines the presence or absence of the object on the basis of the light signal delivered from the light detecting element.

According to the above-described reflection type sensor, the light emitting element emits the light beams belonging to the different wave bands. Accordingly, even when the object absorbs light of a specific wave band, light belonging to another wave band is reflected by the object to be detected by the light detecting element, which delivers the light signal. Thus, even when the object selectively absorbs the light of the specific wave band, this can reliably be detected. Moreover, since a plurality of the LED chips are disposed to be adjacent to each other and integrated into the package, a single small-sized light emitting element emits light beams belonging to a plurality of wave bands under substantially the same condition. Consequently, the aforesaid sensor can perform a more accurate detection than the one provided with a plurality of discrete light emitting elements.

In a preferred form, at least one of the LED chips emits visible light. Consequently, a position of detection can readily be obtained since a location where the light is irradiated is rendered clear.

In another preferred form, the reflection type sensor further comprises a sensor head on which a single light emitting element and two light detecting elements are mounted. In this construction, the sensor head is moved relative to the object, and the two light detecting elements are arranged at both sides of the light emitting element perpendicularly to a direction in which the sensor head is moved. The light reflected on the object is detected by the two light detecting elements located at both sides of the light emitting element respectively. Consequently, the reflected light can reliably be detected in whatever direction a reflecting face of the object is directed.

BRIEF DESCRIPTION OF THE DRAWINGS

Other objects, features and advantages of the present invention will become clear upon reviewing the following description of the preferred embodiment, made with reference to the accompanying drawings, in which.

DETAILED DESCRIPTION OF THE INVENTION

Figure 1:
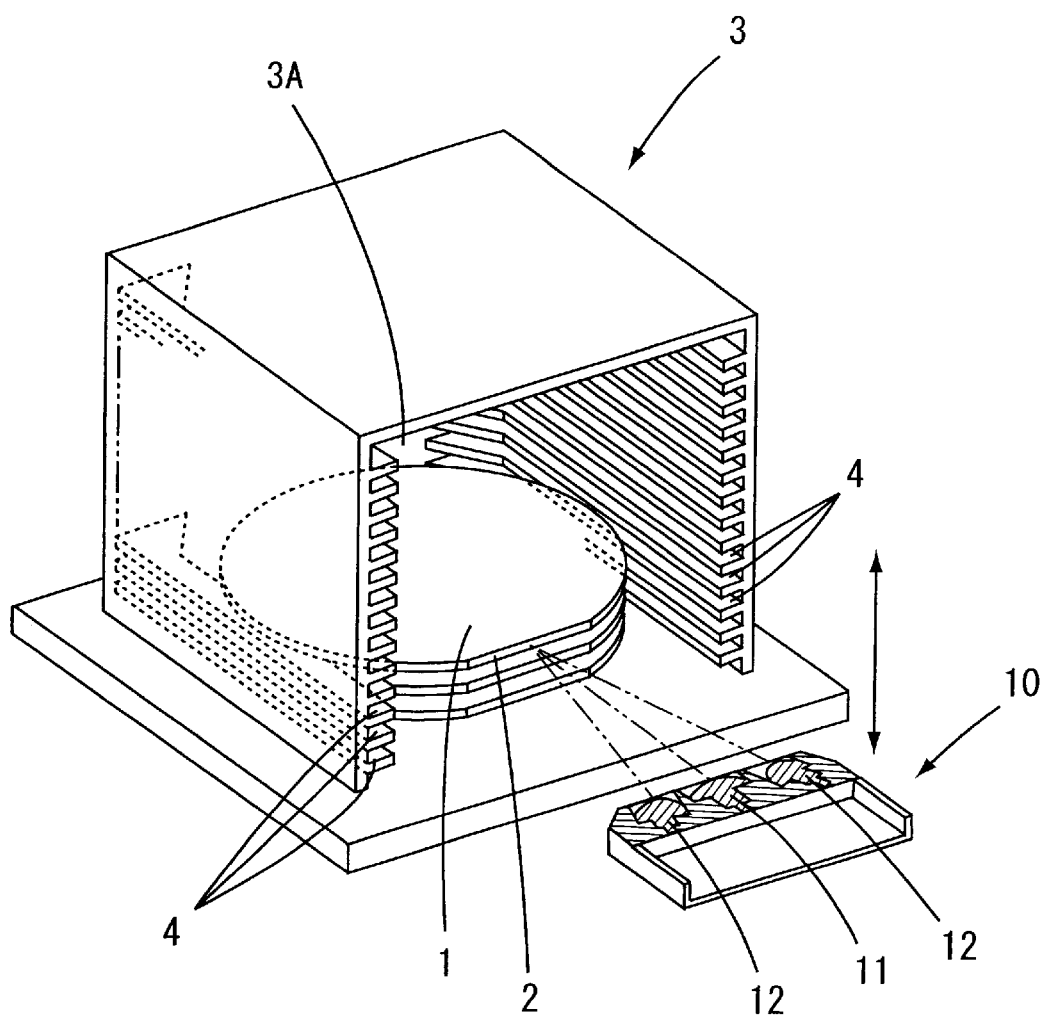
FIG. 1 is a perspective view of the reflection type sensor of one embodiment in accordance with the present invention.

One embodiment of the present invention will be described with reference to FIGS. 1 to 6. Referring to FIG. 1, a sensor head 10 of the reflection type sensor of the embodiment is shown as confronting an object to be detected, for example, a semiconductor wafer 1. The sensor head 10 includes a light emitting element 11 and a light detecting element 12. The wafer 1 generally has an orientation flat 2 formed by cutting off a part of a circumferential edge thereof so as to form a straight edge. A number of the wafers 1 are loaded in a cassette carrier 3 when transported or processed. The carrier 3 has a number of grooves 4 formed on each of opposite inner side walls thereof so that the wafers 1 are placed in the opposite grooves with the orientation flats 2 being directed toward an opening 3A of the carrier 3. The orientation flats 2 may or may not be directed toward the opening 3A. Further, the wafer 1 may or may not be formed with the orientation flat 2.

Figure 2:
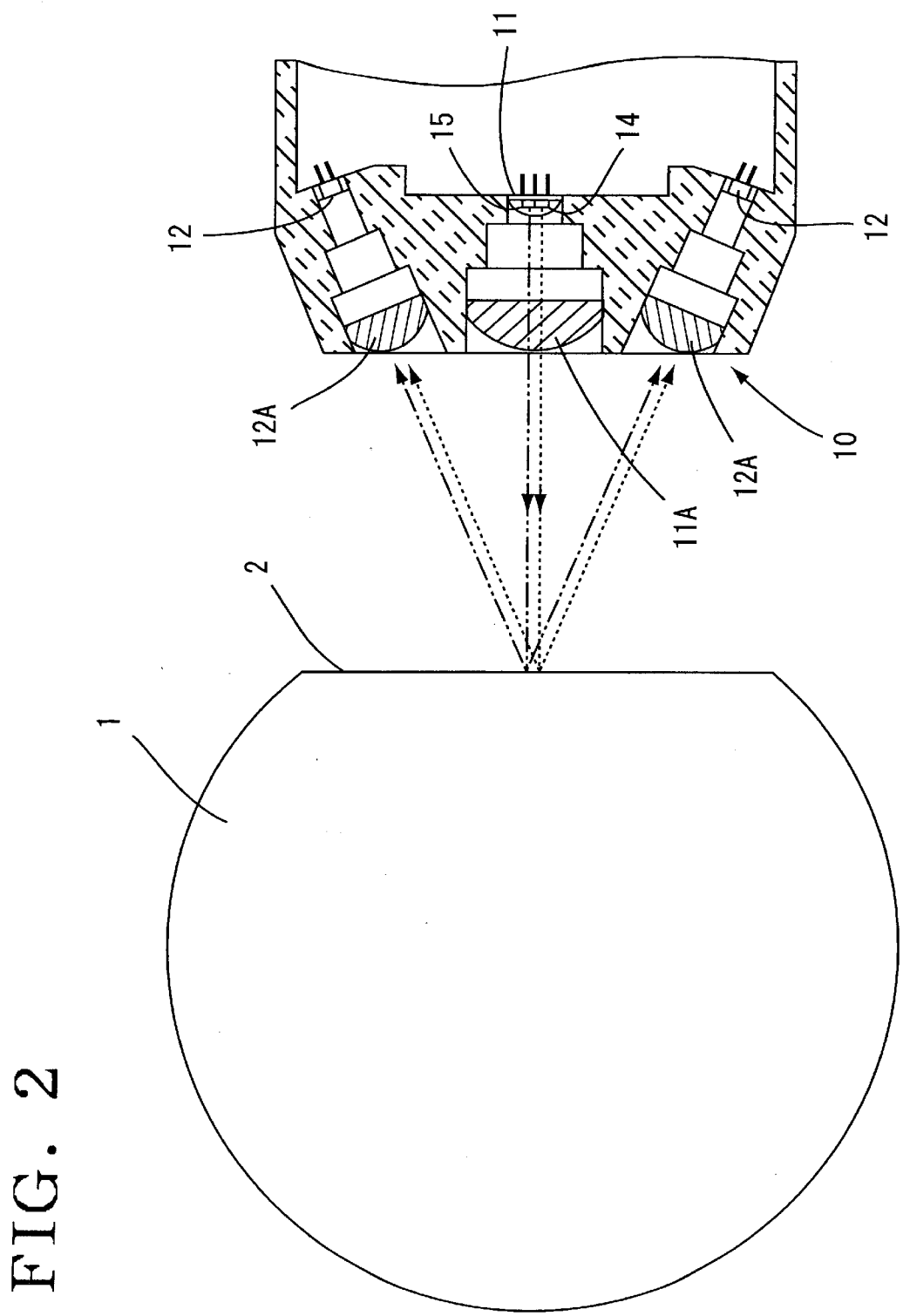
FIG. 2 is a sectional plan view of the reflection type sensor.
Figure 3:
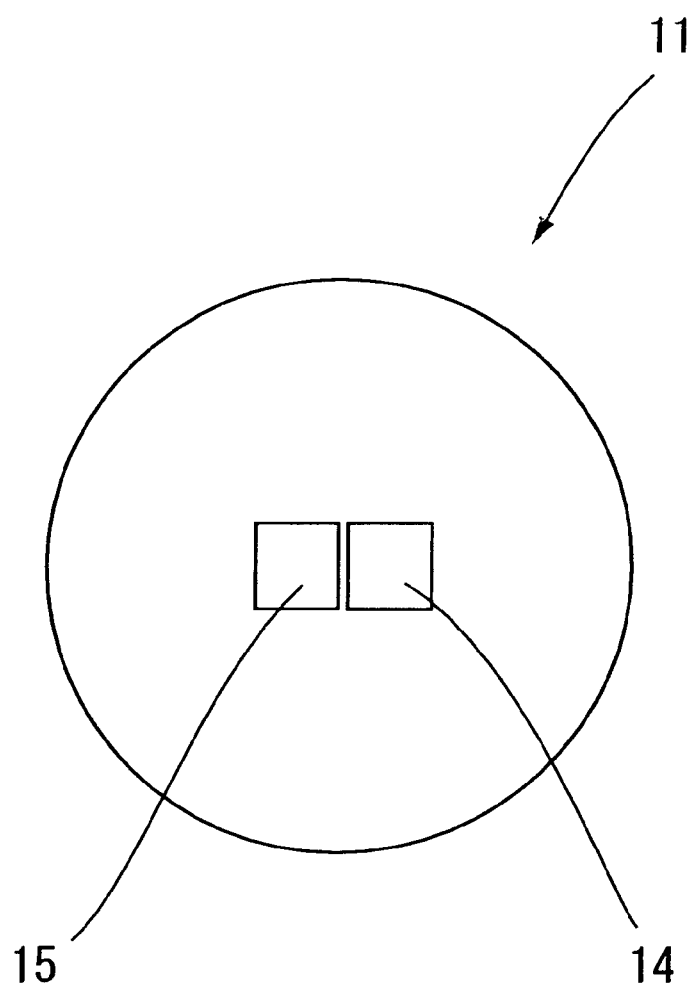
FIG. 3 is a plan view of a light emitting element, showing the locations of LED chip.
Figure 4:
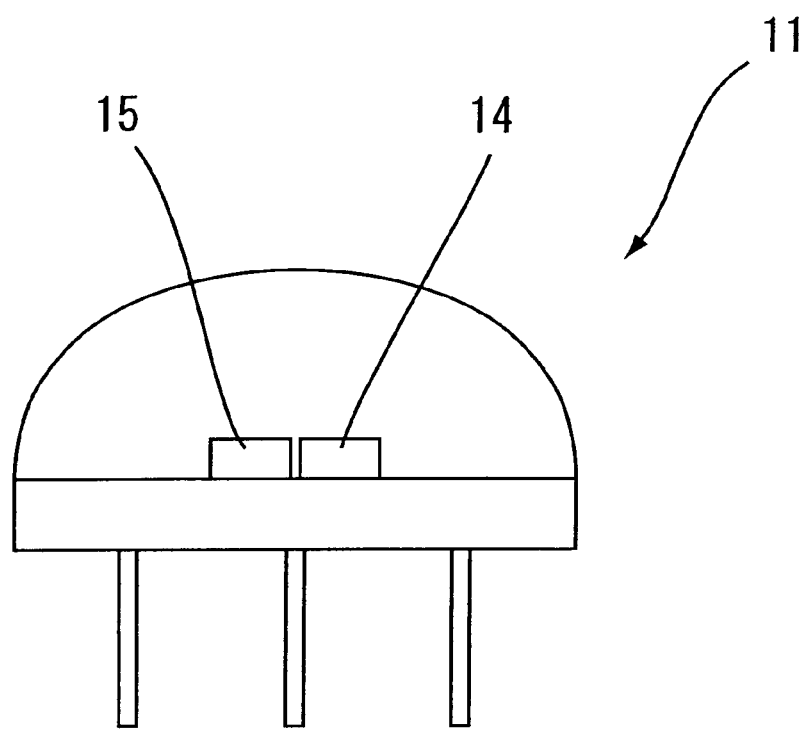
FIG. 4 is a side view of the light emitting element, showing the locations of the LED chips.
Figure 5:
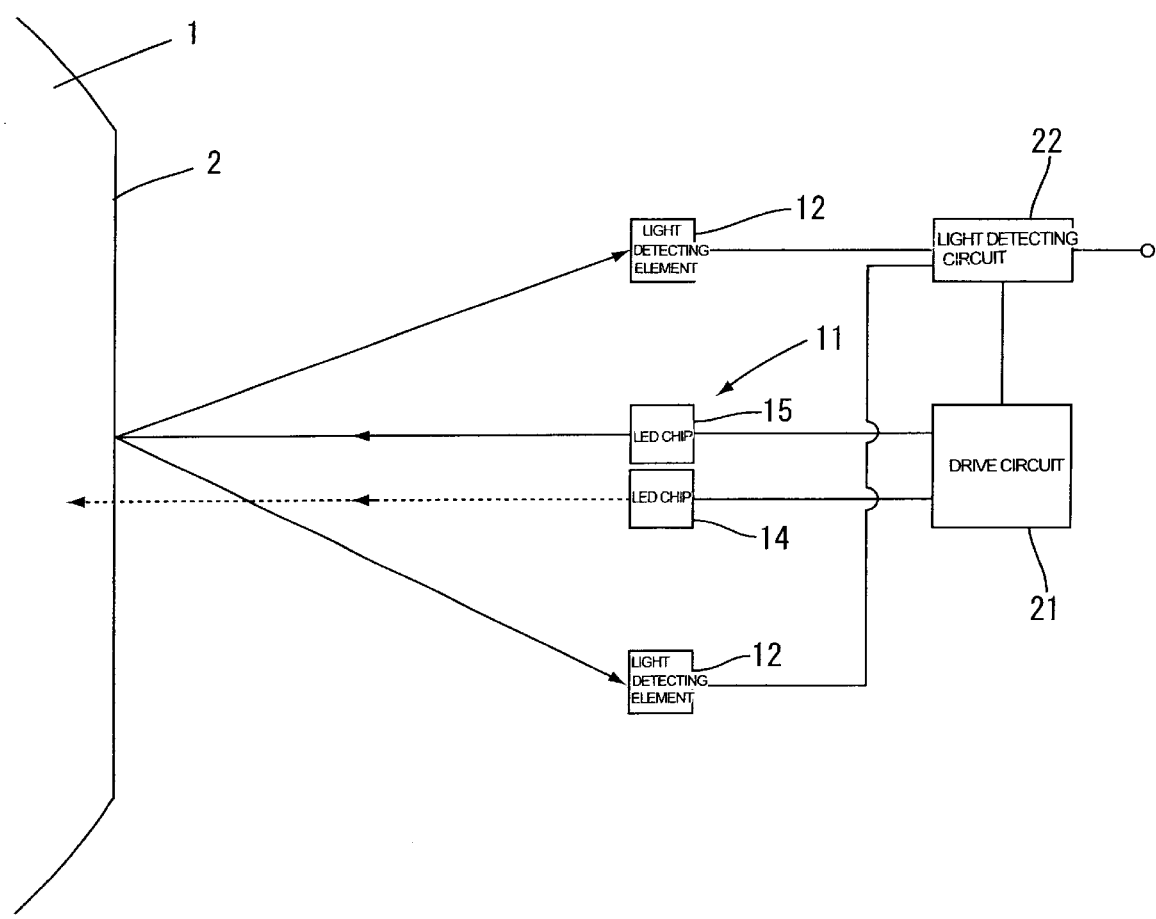
FIG. 5 shows the direction in which the light is emitted from each LED chip.
Figure 6:
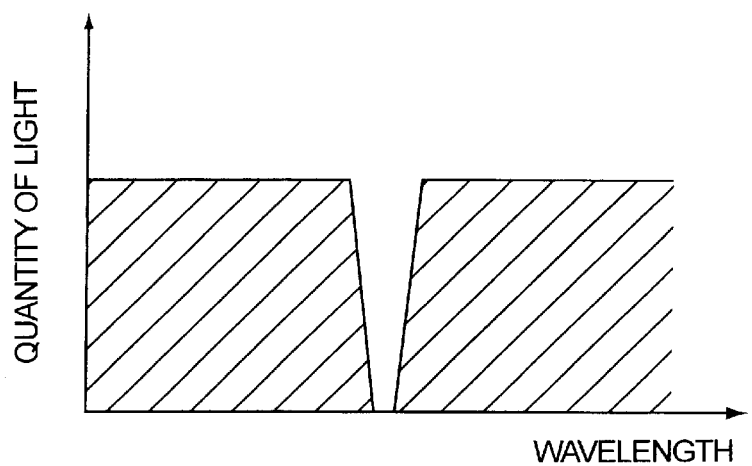
FIG. 6A is a graph showing the light absorbing characteristic of a wafer.
FIG. 6B is a graph showing photoelectric conversion characteristic of a light detecting element and emission spectrum of each LED chip.
Figure 6:
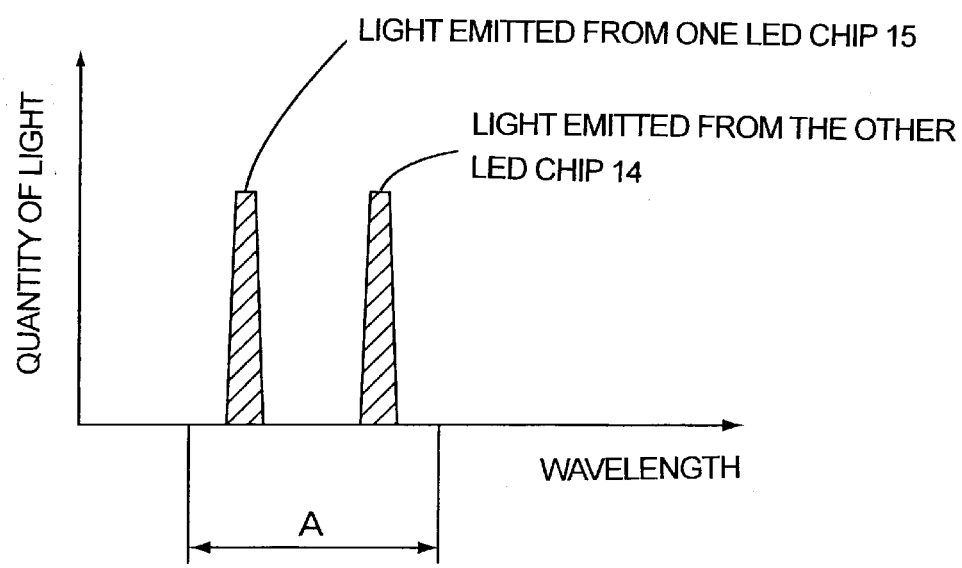
Figure 7:
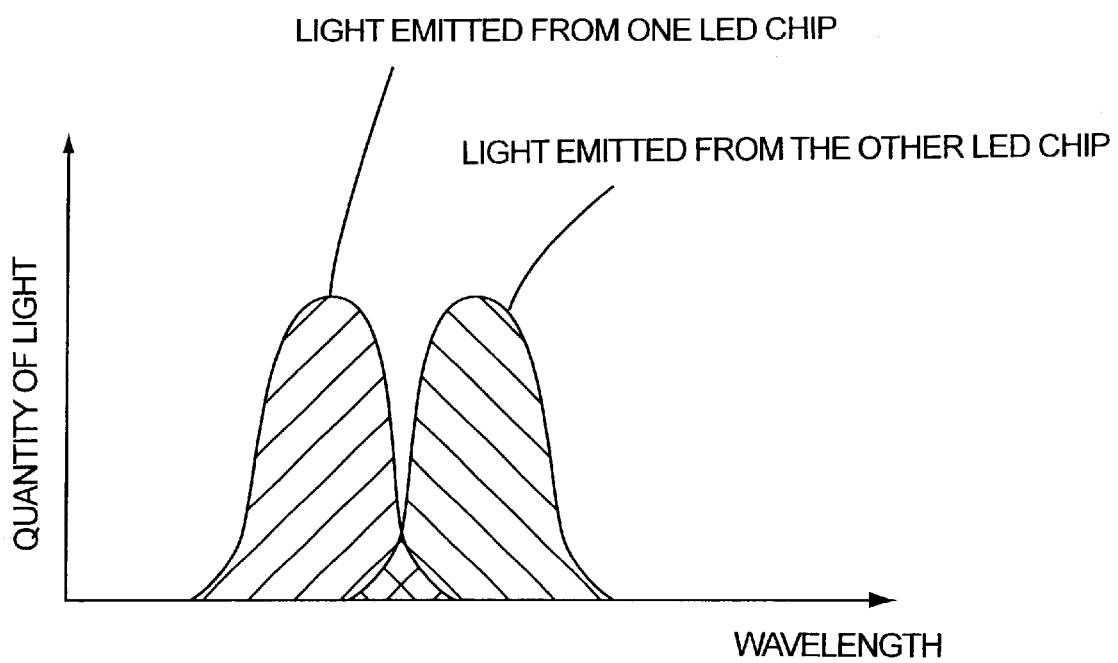
FIG. 7 is a graph showing an emission spectrum of the light emitting element.

The sensor head 10 is mounted on an actuator (not shown) so as to be moved across the orientation flat 2 of each wafer 1 or vertically as viewed in FIG. 1 along the horizontally central opening 3A. The sensor head 10 includes a single light emitting element 11 and two light detecting elements 12 disposed at both opposite sides of the light emitting element 11 respectively as shown in FIG. 2. In other words, the light emitting element is arranged between the light detecting elements so that the light emitting and light detecting elements are arranged along a direction substantially perpendicular to the thickness direction of the object to be detected. Each light detecting element 12 has an optical axis inclined toward the other. In other words, the optical axes of the light detecting elements 12 are inclined toward each other as shown in FIG. 2. Two condensing lenses 11A and 12A are disposed in front of the light emitting element and the light detecting elements 12, respectively. The light emitting element 11 is fixed to the sensor head 10 and includes a pair of LED chips 14 and 15 disposed to be adjacent to each other and integrated into a package as shown in FIGS. 3 and 4. The LED chips 14 and 15 are arranged perpendicularly to a direction in which the light emitting element 11 is moved relative to the object.

FIG. 6B shows the frequency components of light beams emitted from the LED chips 14 and 15, respectively. The LED chips 14 and 15 emit light beams belonging to different wave bands. One LED chip 14 or 15 emits visible light. Reference character "A" in FIG. 6B designates a wave band of light causing the light detecting element 12 to perform a photoelectric conversion, whereupon a light signal is delivered from the element. The wave band A includes the wave bands of light beams emitted from the LED chips 14 and 15.

The operation of the reflection type sensor will now be described. Upon start of the sensor, a drive circuit 21 supplies a pulse signal of a predetermined period to the LED chips 14 and 15, so that the chips emit light synchronously, for example. The actuator is then operated to move the sensor head 10 across the orientation flat 2 of the wafer 1 or vertically in FIG. 1. Since the LED chips 14 and 15 are arranged perpendicularly to the direction in which the sensor head 10 is moved, the LED chips 14 and 15 confront the wafer 1 and emit light, which is irradiated onto the orientation flat 2 of the wafer 1. The wave band of the light emitted from the LED chip 14 differs from the wave band of the light emitted from the LED chip 15, and vice versa. Accordingly, a quantity of light irradiated on the wafer 1 reaches the peaks in two wave bands as shown in FIG. 6B.

Suppose now that a nitrogen film coated on the wafer 1 has a property of absorbing light from the LED chip 14. Light emitted from the LED chip 14 is then absorbed into the wafer 1 and accordingly, light reflected on the wafer 1 does not contain the light emitted from the LED chip 14 as shown in FIG. 6A. However, since the wave band to which the light emitted from the LED chip 15 belongs differs from the wave band to which the light emitted from the LED chip 14, the light emitted from the LED chip 15 is not absorbed into the wafer 1 but is reflected thereon to be detected by the light detecting elements 12. As a result, the light detecting elements 12 deliver respective light signals. The light signals are supplied to the light detecting circuit 22 to be amplified. When the light signal exceeds a predetermined level, the presence of the wafer 1 in front of the elements 11 and 12 is detected.

According to the foregoing embodiment, the light emitting element 11 emits light beams belonging to the two different wave bands. Accordingly, even when the wafer 1 absorbs light of a specific wavelength, the light belonging to at least one wave band is reflected on the wafer to be detected by the light detecting element 12. Consequently, the wafer 1 can reliably be detected.

Moreover, the light emitting element 11 comprises the two LED chips integrated into a package. This arrangement can provide a smaller reflection type sensor as compared with an arrangement in which a plurality of LED chips are packaged individually. Further, since the LED chips 14 and 15 are disposed to be adjacent to each other, a quantity of emitted light is increased. Accordingly, when the reflection type sensor of the foregoing embodiment is used to detect an object having no light-absorbing property, an intensity of reflected light is increased. As a result, the detection accuracy can be improved.

Further, the LED chips 14 and 15 are arranged perpendicularly to the direction in which the sensor head 10 is moved relative to the object. Accordingly, the light detecting element 12 detects the reflected light regardless of which LED chip has emitted the light. Thus, the position of the wafer 1 can be detected without determining which one of the LED chips 14 and 15 has emitted the detected light. Additionally, either LED chip 14 or 15 emits the visible light. Since the visible light serves as a mark representative of a position of detection, the reflection type sensor can be handled readily.

Although the object to be detected is the wafer 1 in the foregoing embodiment, it may be a magnetic disc substrate, a clockface, a flat lid of a case, a pulley, a washer, etc. Further, the object to be detected may or may not be flat or plate-shaped. Although the light emitting element comprises two LED chips in the foregoing embodiment, the element may comprise three or more LED chips, instead. Further, the wave bands may partially be superposed on condition that they differ from each other or from one another.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A reflection type sensor for detecting an object, comprising:
   a sensor head operable to move relative to the object in a thickness direction of the object;
   a light emitting element mounted on said sensor head so as to move with said sensor head in the thickness direction, said light emitting element operable to emit light toward the object and including a plurality of LED chips arranged adjacent to each other so as to be aligned substantially perpendicular to the thickness direction and integrated into a package, said LED chips operable to emit light beams belonging to different wave bands;
   two light detecting elements mounted on said sensor head so as to detect the light emitted by said LED chips and reflected by the object, and so as to perform a photoelectric conversion for the light beams belonging to the different wave bands, thereby generating a light signal, said light emitting element being arranged between said light detecting elements such that said light detecting elements and said light emitting element are arranged along a direction substantially perpendicular to the thickness direction, and said light detecting elements being oriented such that optical axes of said light detecting elements are inclined toward each other; and
   a light detecting circuit for determining presence or absence of the object based on the light signal generated by and received from said light detecting elements.

2. The reflection type sensor according to claim 1, wherein at least one of said LED chips emits visible light.

3. The reflection type sensor according to claim 1, wherein each of said light detecting elements and said light emitting element includes a condensing lens.

* * * * *